United States Patent
Chuck et al.

(10) Patent No.: US 12,550,641 B2
(45) Date of Patent: Feb. 10, 2026

(54) GENERATING A LOW-TEMPERATURE SUBSTRATE PROTECTIVE LAYER

(71) Applicant: Lam Research Corporation, Fremont, CA (US)

(72) Inventors: Jeremiah Christopher Chuck, Castro Valley, CA (US); Jordan Yu, Oakland, CA (US); Xiuqi Fang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 523 days.

(21) Appl. No.: 18/000,092

(22) PCT Filed: Apr. 15, 2021

(86) PCT No.: PCT/US2021/027556
§ 371 (c)(1),
(2) Date: Nov. 28, 2022

(87) PCT Pub. No.: WO2021/242433
PCT Pub. Date: Dec. 2, 2021

(65) Prior Publication Data
US 2023/0215726 A1    Jul. 6, 2023

Related U.S. Application Data

(60) Provisional application No. 63/032,476, filed on May 29, 2020.

(51) Int. Cl.
*H01L 21/02* (2006.01)
*C23C 16/455* (2006.01)
*H01L 21/304* (2006.01)

(52) U.S. Cl.
CPC .... *H01L 21/0228* (2013.01); *H01L 21/02181* (2013.01); *H01L 21/02186* (2013.01);
(Continued)

(58) Field of Classification Search
CPC ........... H01L 21/0228; H01L 21/02181; H01L 21/02186; H01L 21/02189;
(Continued)

(56) References Cited

U.S. PATENT DOCUMENTS

2005/0184251 A1   8/2005   Oi et al.
2006/0065829 A1   3/2006   Lu
(Continued)

FOREIGN PATENT DOCUMENTS

EP           1531191        5/2005
KR       20000020989 A      4/2000
(Continued)

OTHER PUBLICATIONS

Wang et al., "Atomic layer deposition of zirconium oxide thin films", Journal of Materials Research, vol. 35, issue 7, 2020; pp. 804-812 (Year: 2020).*

(Continued)

*Primary Examiner* — Julia Slutsker
(74) *Attorney, Agent, or Firm* — Schwegman Lundberg & Woessner, P.A.

(57) ABSTRACT

A method for depositing protective layers on a surface of a substrate includes conducting a plurality of ALD cycles in a first reaction chamber to deposit a first protective layer on the substrate. Each ALD cycle of the plurality of ALD cycles is conducted at a deposition temperature below about 100° C. and includes delivering a first precursor gas into the first reaction chamber containing the substrate. A reacting portion of the first precursor gas is absorbed onto a surface of the substrate to form a first sub-layer of the protective layer. A second precursor gas is delivered into the first reaction chamber containing the substrate, a reacting portion of the second precursor gas being absorbed onto the surface of the substrate to form a second sub-layer of the protective layer.

(Continued)

Metrology analysis is performed on the substrate within a second reaction chamber.

23 Claims, 7 Drawing Sheets

(52) U.S. Cl.
CPC .. *H01L 21/02189* (2013.01); *H01L 21/02205* (2013.01); *H01L 21/304* (2013.01); *C23C 16/45544* (2013.01); *C23C 16/45561* (2013.01)

(58) Field of Classification Search
CPC ............. H01L 21/02205; H01L 21/304; C23C 16/45544; C23C 16/45561; C23C 16/45527; C23C 16/405
See application file for complete search history.

(56) References Cited

U.S. PATENT DOCUMENTS

| | | | | |
|---|---|---|---|---|
| 2012/0244721 | A1* | 9/2012 | Morozumi | H10D 1/68 |
| | | | | 118/724 |
| 2017/0067156 | A1 | 3/2017 | Leeser | |
| 2019/0385841 | A1* | 12/2019 | Withers | H10D 30/47 |
| 2020/0350157 | A1* | 11/2020 | Chu | H01L 21/02329 |

FOREIGN PATENT DOCUMENTS

| | | |
|---|---|---|
| KR | 20090083128 A | 8/2009 |
| KR | 20150074770 A | 7/2015 |
| KR | 20170007177 | 1/2017 |
| KR | 102604354 | 11/2023 |
| WO | WO-2021242433 A1 | 12/2021 |

OTHER PUBLICATIONS

Park et al., "Microprobe Analysis of Pt Films Deposited by Beam Induced Reaction," 1998, Jpn. J. Appl. Phys. 37 ,7042 (Year: 1998).*

"Korean Application Serial No. 10-2022-7044065, Voluntary Amendment filed Apr. 15, 2024", w English claims, 6 pgs.

"Taiwanese Application Serial No. 110118956, Office Action mailed Jan. 23, 2025", W machine English Translation, 13 pgs.

"Korean Application Serial No. 10-2022-7044065, Notice of Preliminary Rejection mailed Feb. 7, 2025", W machine English Translation, 7 pgs.

"Korean Application Serial No. 10-2022-7044065, Response filed Apr. 7, 2025 to Notice of Preliminary Rejection mailed Feb. 7, 2025", W English Claims, 28 pgs.

International Application Serial No. PCT/US2021/027556, International Search Report mailed Aug. 6, 2021, 3 pgs.

International Application Serial No. PCT/US2021/027556, Written Opinion mailed Aug. 6, 2021, 3 pgs.

* cited by examiner

GENERATING A LOW-TEMPERATURE SUBSTRATE PROTECTIVE LAYER

CLAIM OF PRIORITY

This application is a U.S. National Stage Filing under 35 U.S.C. 371 from International Application No. PCT/US2021/027556, filed on Apr. 15, 2021, and published as WO 2021/242433 A1 on Dec. 2, 2021, which claims the benefit of priority U.S. Patent Application Ser. No. 63/032,476, filed on May 29, 2020, each of which is incorporated by reference herein in its entirety.

TECHNICAL FIELD

The subject matter disclosed herein generally relates to systems, methods, apparatuses, and machine-readable media associated with the generation of protective layers, such as low-temperature substrate preparation for non-destructive protection of semiconductor device structures using a substrate protective layer.

BACKGROUND

Semiconductor substrate processing apparatuses are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL) processing, and resist removal.

After the semiconductor substrates are manufactured using the above techniques, critical dimension (CD) measurements are often performed as part of substrate metrology and analysis. For example, substrate metrology and analysis may include using ion and electron beams during Focused Ion Beam Scanning Electron Microscopy (FIB-SEM). However, the ion and electron beams associated with FIB-SEM tend to cause damage to semiconductor device structures within the substrate.

The background description provided herein is to generally present the context of the disclosure. It should be noted that the information described in this section is presented to provide the skilled artisan some context for the following disclosed subject matter and should not be considered as admitted prior art. More specifically, work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods, systems, and computer programs are presented for semiconductor substrate processing, including techniques for heater design solutions for chemical delivery systems for a chemical isolation chamber used for processing the semiconductor substrate.

In an example embodiment, a method for depositing protective layers on a surface of a substrate includes conducting a plurality of Atomic Layer Deposition (ALD) cycles in a first reaction chamber to deposit a first protective layer on the substrate. Each ALD cycle of the plurality of ALD cycles is conducted at a deposition temperature below about 100 degrees Celsius and includes delivering a first precursor gas into the first reaction chamber containing the substrate. A reacting portion of the first precursor gas is absorbed onto a surface of the substrate to form a first sub-layer of the protective layer. A non-reacting portion of the first precursor gas is purged from the first reaction chamber, the non-reacting portion of the first precursor gas not being absorbed onto the surface of the substrate. A second precursor gas is delivered into the first reaction chamber containing the substrate, a reacting portion of the second precursor gas being absorbed onto the surface of the substrate to form a second sub-layer of the protective layer. A non-reacting portion of the second precursor gas is purged from the first reaction chamber, the non-reacting portion of the second precursor gas not being absorbed onto the surface of the substrate. Metrology analysis is performed on the substrate within a second reaction chamber.

In another example embodiment, an apparatus for processing a substrate includes a reaction chamber containing the substrate, a chemical delivery module in fluid communication with the reaction chamber, a controller, and a pump. The chemical delivery module includes a plurality of precursor gas sources. The controller is coupled to the reaction chamber and the chemical delivery module. The controller is configured to perform ALD operations including delivering a first precursor gas from the chemical delivery module into the reaction chamber, a reacting portion of the first precursor gas being absorbed onto a surface of the substrate to form a first sub-layer of a protective layer. The ALD operations further include delivering a second precursor gas from the chemical delivery module into the reaction chamber, a reacting portion of the second precursor gas being absorbed onto the surface of the substrate to form a second sub-layer of the protective layer. The ALD operations further include maintaining a deposition temperature within the reaction chamber from about 40 degrees Celsius to about 100 degrees Celsius during forming the first and second sub-layers of the protective layer. The pump is coupled to the reaction chamber and is configured to purge non-reacting portions of the first precursor gas and the second precursor gas from the reaction chamber.

In yet another example embodiment, a method for depositing protective layers on a surface of a substrate includes conducting a plurality of Atomic Layer Deposition (ALD) cycles in a first reaction chamber to deposit a first protective layer on the substrate. An ALD cycle of the plurality of ALD cycles includes heating the first reaction chamber containing the substrate to a deposition temperature of below about 100 degrees Celsius. A carrier gas with a water precursor gas is delivered into the first reaction chamber. A reacting portion of the water precursor is absorbed onto the surface of the substrate to form an oxide layer. The carrier gas with a Tetrakis(dimethylamino)-(TDMA)-based precursor gas is delivered into the first reaction chamber. A reacting portion of the TDMA-based precursor gas is absorbed onto the surface of the substrate to form a metal-oxide layer. A non-reacting portion of the TDMA-based precursor gas is purged from the first reaction chamber using the carrier gas, the non-reacting portion of the TDMA-based precursor gas not being absorbed onto the surface of the substrate. Metrology analysis is performed on the substrate within a second reaction chamber.

BRIEF DESCRIPTION OF THE DRAWINGS

Various ones of the appended drawings merely illustrate example embodiments of the present disclosure and cannot be considered as limiting its scope.

DETAILED DESCRIPTION

Figure 1:
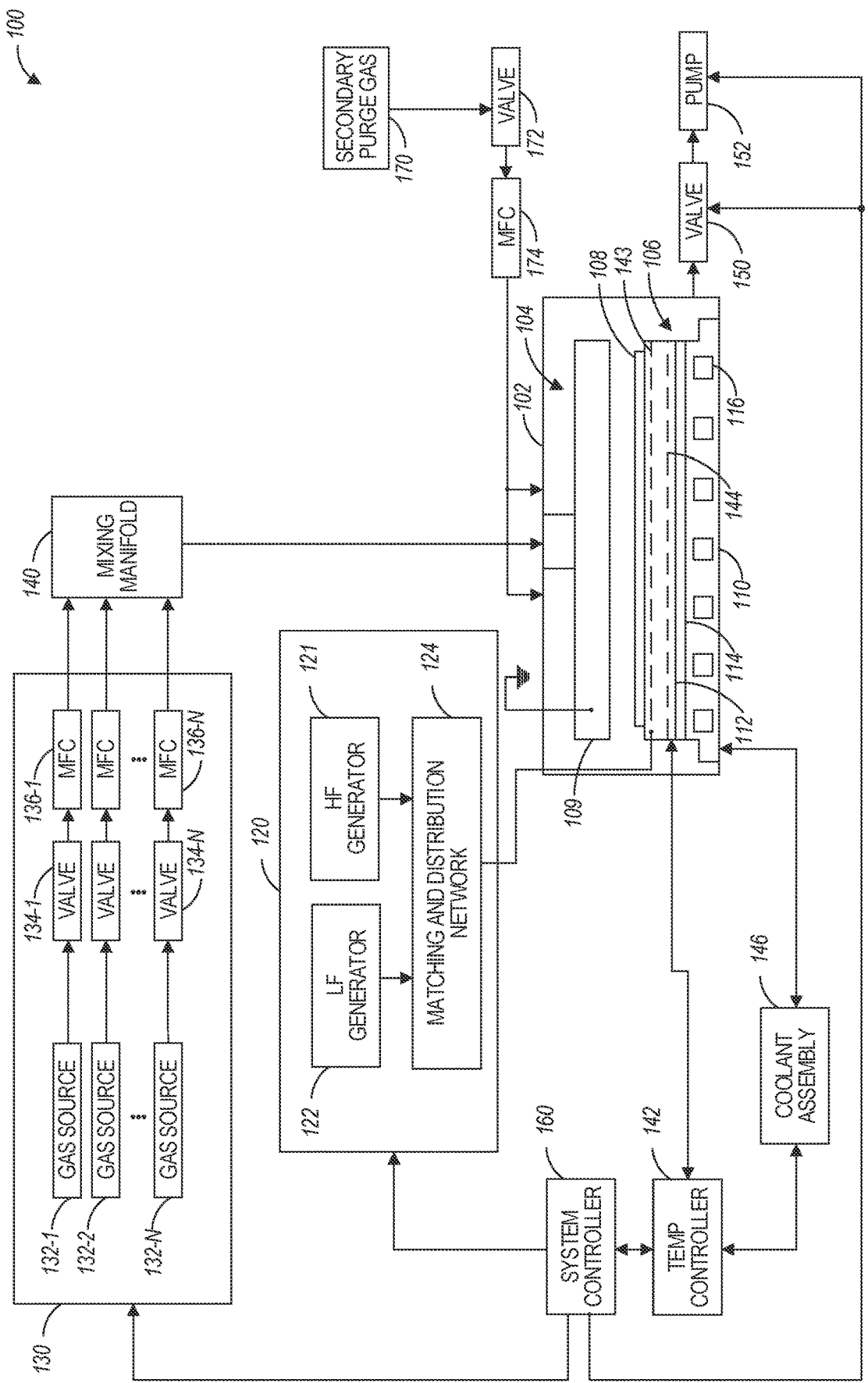
FIG. 1 is a functional block diagram of an example of a substrate processing system in which examples of the present disclosure may be used.

The description that follows includes systems, methods, techniques, instruction sequences, and computing machine program products (e.g., stored on machine-readable media) that embody illustrative embodiments of the present disclosure. In the following description, for purposes of explanation, numerous specific details are outlined to provide a thorough understanding of example embodiments directed to additive manufacturing (such as direct metal laser sintering) using sonic excitation (e.g., ultrasonic and megasonic vibration) to reduce hot tearing. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2020, All Rights Reserved.

In this application, the terms "semiconductor wafer," "wafer," "substrate," "semiconductor substrate," and "wafer substrate" are used interchangeably. The terms "chamber", "reaction chamber," "deposition chamber," "reactor," "chemical isolation chamber," "processing chamber," and "substrate processing chamber" are also used interchangeably.

One type of substrate processing apparatus includes a reaction chamber containing top and bottom electrodes where radio frequency (RF) power is applied between the electrodes to excite a process gas into a plasma for processing semiconductor substrates in the reaction chamber.

Another type of substrate processing apparatus includes an ALD tool, which is a specialized type of CVD processing system in which ALD reactions occur between two or more chemical species introduced as process gasses within a reaction chamber (e.g., an ALD reaction chamber). The process gasses (e.g., precursor gases) are used to form (e.g., during multiple ALD cycles) a thin film deposition of a material on a substrate, such as a silicon wafer as used in the semiconductor industry. The precursor gases are sequentially introduced into the ALD processing chamber from a gas source so that the gases react with a surface of the substrate to form a deposition layer upon combining. For example, the substrate is typically exposed to a first chemical (or a combination of chemicals) to form an absorbed layer. The excess of the first chemical or chemicals is removed by pumping or purging. A second chemical or combination of chemicals is introduced to react with the absorbed layer to form a deposited material layer. The two chemicals or combinations of chemicals are selected specifically to react with one another to form the deposited material layer. A more detailed description of a substrate processing apparatus with a reaction chamber is provided in connection with FIG. 1 and FIG. 2.

A substrate (e.g., as generated by the substrate processing apparatus of FIG. 1 or FIG. 2) includes features such as trenches, contacts, and vias that require insulation deposited in them when semiconductor device structures are formed on the substrate. As the device structure features shrink in dimension (e.g., sub-50 nm scale), such structures become more susceptible to damage from ion and electron beams associated with FIB-SEM used in connection with substrate metrology and analysis after the substrate is processed. Techniques disclosed herein include using low-temperature ALD to deposit a protective layer on the substrate (e.g., during a plurality of ALD cycles in a substrate processing apparatus), which protects device structures in the substrate from damage during metrology and analysis so that CD measurements can be taken with accuracy and consistency. In some aspects, due to the use of low temperature in the reaction chamber (e.g., a temperature from about 40 degrees Celsius to about 100 degrees Celsius), the resulting protective layer is amorphous, which reduces stress on the underlying substrate crystalline layers.

FIG. 1 is a functional block diagram of an example of a substrate processing system 100 in which examples of the present disclosure may be used. Referring now to FIG. 1, the example substrate processing system 100 is configured for performing deposition as shown. While a PECVD substrate processing system is shown as the system 100, a PEALD substrate processing system or other substrate processing system may be used. The substrate processing system 100 includes a reaction chamber 102 that encloses other components of the substrate processing system 100 and contains plasma. The reaction chamber 102 includes a gas distribution device 104 and substrate support 106, such as an electrostatic chuck (ESC). During operation, a substrate 108 is arranged on the substrate support 106.

In some examples, the gas distribution device 104 may include a powered showerhead 109 that distributes process gases over the substrate 108 and induces ion bombardment. The showerhead 109 may include a stem portion including one end connected to a top surface of the reaction chamber 102. A base portion is generally cylindrical and extends radially outwardly from an opposite end of the stem portion at a location that is spaced from the top surface of the reaction chamber 102. A substrate-facing surface or faceplate of the base portion of the showerhead 109 includes a plurality of distributed holes through which process gas (or gases) flows. The gas distribution device 104 may be made of a metallic material and may act as an upper electrode. Alternately, the gas distribution device 104 may be made of a non-metallic material and may include an embedded electrode. In other examples, the upper electrode may include a conducting plate and the process gases may be introduced in another manner.

The substrate support 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

A Radio Frequency (RF) generating system 120 generates and outputs an RF voltage to one of the upper electrodes (e.g., the gas distribution device 104) and the lower electrode (e.g., the baseplate 110 of the substrate support 106). The other one of the upper electrode and the lower electrode may be direct current (DC) grounded at 143, alternating current (AC) grounded, or floating. In some examples, the RF generating system 120 may supply dual-frequency power including a high frequency (HF) generator 121 and a low frequency (LF) generator 122 that generate the HF and LF power (at predetermined frequencies and power levels, respectively) that is fed by a matching and distribution network 124 to the upper electrode or the lower electrode (or the showerhead).

A chemical delivery system 130 (also referred to as a chemical delivery module) includes process gas sources (such as one or more precursor canisters) 132-1, 132-2, . . . , and 132-N (collectively, process gas sources 132), where N is an integer greater than zero. The process gas sources are fluidly coupled (e.g., via a plurality of gas lines) to corresponding valves 134-1, 134-2, . . . , and 134-N.

The process gas sources 132 supply one or more process gas mixtures, dopants, carrier gases, liquid precursors, precursor gases, and/or purge gases. In some examples, the chemical delivery system 130 delivers a precursor gas, such as a mixture of tetraethyl orthosilicate (TEOS) gas, a gas including an oxygen species and argon (Ar) gas during deposition, and dopants including triethyl phosphate (TEPO) and/or triethyl borate (TEB). In some examples, diffusion of the dopants occurs from the gas phase. For example, a carrier gas (e.g., nitrogen, argon, or other) is enriched with the desired dopant (also in gaseous form, e.g., triethyl phosphate (TEPO) and/or triethyl borate (TEB)) and supplied to the silicon wafer on which a concentration balance can take place. In subsequent processes, a wafer may be placed in a quartz tube that is heated to a certain temperature.

Returning to FIG. 1, the process gas sources 132 are connected by valves 134-1, 134-2, . . . , and 134-N (collectively, valves 134) and mass flow controllers (MFCs) 136-1, 136-2, . . . , and 136-N (collectively, MFCs 136) to a mixing manifold 140 which is in fluid communication with the reaction chamber 102. The process gases are supplied to the mixing manifold 140 and mixed therein. An output of the mixing manifold 140 is fed to reaction chamber 102. In some aspects, the mixing manifold is heated to a predetermined temperature to supply the precursor gases to the reaction chamber at a specific temperature (or a temperature range). In some examples, the output of the mixing manifold 140 is fed to the showerhead 109. Secondary purge gas 170 may be supplied to the processing chamber 102, such as behind the showerhead 109, via a valve 172 and an MFC 174. Although illustrated separately, the mixing manifold 140 may be part of the chemical delivery system 130.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate. The temperature controller 142 may be used to control the plurality of TCEs 144 to control the temperature of the substrate support 106 and the substrate 108. The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106. A valve 150 and pump 152 (e.g., an exhaust pump) may be used to control pressure and to evacuate reactants from the processing chamber 102.

A system controller 160 may be used to control components of the substrate processing system 100, including dynamically monitoring and adjusting the surface temperature of the heating elements of gas lines within the chemical delivery system 130. Although shown as separate controllers, the temperature controller 142 may be implemented within the system controller 160.

In an example embodiment (e.g., when the substrate processing system 100 is used for ALD-based processing), the chemical delivery system 130 can be configured to deliver one or more precursor gases via a carrier gas into the reaction chamber 102 (e.g., in connection with the low-temperature generation of a substrate protective layer). Example precursor gases that can be used for protective layer generation include a water precursor gas (e.g., water vapor) and Tetrakis(dimethylamino)-(TDMA)-based precursor gases. The TDMA-based precursor gases may include TDMA-metal precursor gases, such as Tetrakis(dimethylamino)hafnium(IV), Tetrakis(dimethylamino)titanium(IV), Tetrakis(dimethylamino)zirconium(IV), Tetrakis(dimethylamino)tin(IV), and Tetrakis(dimethylamino)vanadium(IV). Additionally, a controller (e.g., the system controller 160) can be configured to control the heating temperature for each process gas supplied by the process gas sources 132, the heating temperature of the mixing manifold 140 (and its connections to the reaction chamber), and heating temperature of the reaction chamber 102. An example ALD-based substrate processing system that can be used for protective layer generation using disclosed techniques is described in connection with FIG. 2.

Figure 2:
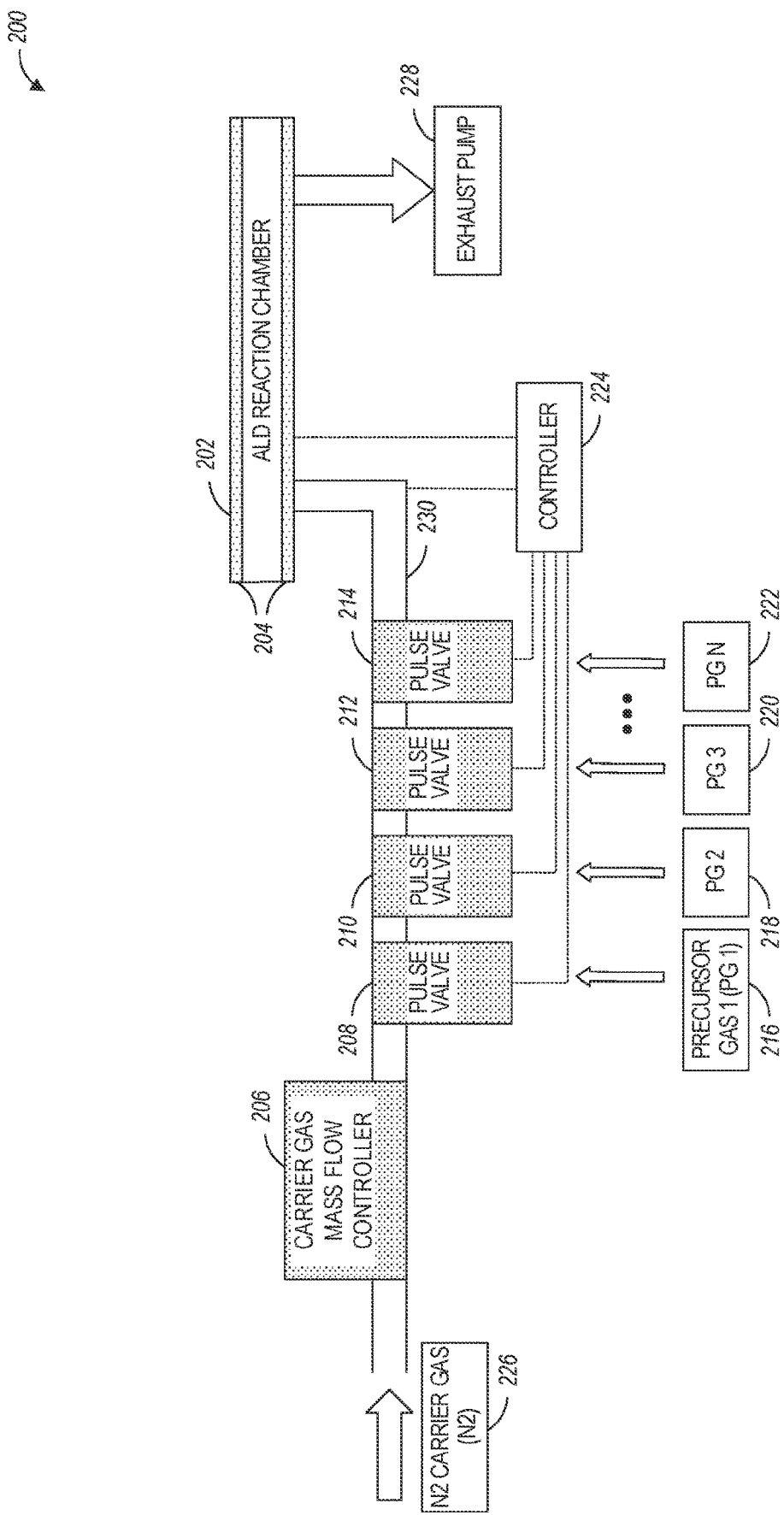
FIG. 2 is a functional block diagram of an ALD-based substrate processing system, which can be used for low-temperature generation of a substrate protective layer, according to some embodiments.

FIG. 2 is a functional block diagram of an ALD-based substrate processing system 200, which can be used for low-temperature generation of a substrate protective layer, according to some embodiments. Referring to FIG. 2, the ALD-based substrate processing system 200 includes a reaction chamber 202, a carrier gas MFC 206, pulse valves 208, 210, 212, . . . , 214, a controller 224, a mixing manifold 230, and a pump 228. The reaction chamber 202 further includes heating elements 204 for heating the reaction chamber to a preconfigured temperature.

The pulse valves 208, 210, 212, . . . 214 are configured to supply (e.g., via a pulse) corresponding precursor gases 216, 218, 220, . . . , 224 into the mixing manifold 230. The carrier gas MFC 206 is configured to supply carrier gas 226 (e.g., nitrogen or $N_2$) into the mixing manifold 230 to carry one or more of the precursor gases 216, 218, 220, . . . , 222 into the reaction chamber 202 during multiple ALD cycles associated with an ALD process.

Controller 224 comprises suitable circuitry, logic, interfaces, and/or code and is configured to control the delivery of the carrier gas 226 with one or more of the precursor gases 216, . . . , 222 into the mixing manifold 230 and the reaction chamber 202 containing a substrate, as well as purging any non-reacting portion of a precursor gas from the reaction chamber 202 via the pump 228 (e.g., after a reacting portion of the precursor gas has been absorbed via a chemical reaction onto the surface of the substrate). For example, controller 224 is configured to control the flow (e.g., standard cubic centimeters per minute, or sccm) of the carrier gas 226, pulse durations of the pulse valves 208, . . . , 214 delivering the precursor gases into the reaction chamber 202, as well as the duration of any pre-configured time intervals (or wait durations) between the delivery of different precursor gases. Additionally, controller 224 is configured to control the heating temperature of the precursor gases 216, . . . , 222, the mixing manifold 230, and the reaction chamber 202. Example heating temperatures, carrier gas flow measures, precursor gas pulse durations, and wait durations are provided hereinbelow.

In some aspects, controller 224 is configured to perform functions associated with the low-temperature generation of a protective layer on a surface of a substrate using one or more ALD cycles taking place in the reaction chamber 202. The controller 224 can set (and maintain) the following temperature parameters for the system components of the ALD-based substrate processing system 200 during an example low-temperature generation of a substrate protective layer:

(a) the reaction chamber 202 is set to a low-temperature setting, such as a temperature of below about 100 degrees Celsius (or 100° C.), including a temperature above about 60° C. and below about 100° C., or a temperature above about 40° C. and below about 100° C. (other temperature ranges below about 100° C. may also be used for the reaction chamber 202);

(b) the mixing manifold 230 is set to a temperature of about 120° C.; and (c) each of the precursor gases 216, 218, 220, . . . , 222 is set to a temperature of about 75° C.

In an example embodiment, controller 224 configures the carrier gas MFC 206 to initiate supply of the carrier gas 226 into the mixing manifold 230 at a flow rate of about 90 sccm for the duration of the ALD cycles used for generation of the protective layer.

In an example embodiment, controller 224 can detect the insertion of a substrate within the reaction chamber 202 and can initiate a wait timer (e.g., about 10 minutes) so that the substrate stabilizes inside the reaction chamber.

In an example embodiment, controller 224 configures a plurality of ALD cycles in the reaction chamber 202, where each ALD cycle is performed after the above-described parameters for the system components of the ALD-based substrate processing system 200 have been set. In some aspects, an example ALD cycle used for depositing a protective layer on a surface of the substrate within the reaction chamber 202 includes the following four processing sequences:

(a) Water precursor (e.g., water vapor) is used as a first precursor gas 216, which is pulsed via pulse valve 208 for about 0.015 seconds within the reaction chamber 202. A reacting portion of the first precursor gas 216 is absorbed onto the surface of the substrate to form a first sub-layer of the protective layer (e.g., an oxide layer).

(b) The controller 224 delays delivery of the next precursor gas by a first preconfigured time interval (e.g., about 3.75 seconds) so that a uniform first sub-layer (e.g., oxidation layer) is deposited on the surface of the substrate. A non-reacting portion of the first precursor gas 216 is purged from the reaction chamber 202 via the constantly flowing carrier gas 226 (since the non-reacting portion of the first precursor gas is not being absorbed onto the surface of the substrate).

(c) A TDMA-based precursor gas is used as a second precursor gas 218, which is pulsed via pulse valve 210 for about 0.1 seconds within the reaction chamber 202. In some aspects, the TDMA-based precursor gas is a TDMA-metal precursor gas which includes at least one of the following: Tetrakis(dimethylamino)hafnium(IV) (or TDMAH), Tetrakis(dimethylamino)titanium(IV) (or TDMAT), Tetrakis(dimethylamino)zirconium(IV) (or TDMAZ), Tetrakis(dimethylamino)tin(IV) (or TDMASn), and Tetrakis(dimethylamino)vanadium(IV) (or TDMAV). A reacting portion of the second precursor gas 218 is absorbed onto the surface of the substrate during a chemical reaction to form a second sub-layer of the protective layer (e.g., a metal oxide layer including one of the following metal oxides: $TiO_2$, $HfM_2$, $ZrO_2$, $SnO_2$, or $VO_2$). In some aspects, a single TDMA-metal precursor gas is used as the second precursor gas 218.

In an example embodiment, a metal oxide layer of $TiO_2$ is deposited onto the surface of the substrate when the second precursor gas 218 is TDMAT (which follows the oxidation resulting from the water vapor used as the first precursor gas). The formation of the metal oxide layer of $TiO_2$ can be expressed by the following two half-reactions: $1^{st}$ Half Reaction: $Ti(N(CH_3)_2)_4 + TiO2\text{-}OH^* \rightarrow NH(CH_3)_2 + TiO2\text{-}O\text{---}Ti(N(CH_3)_2)_3^*$; and $2^{nd}$ Half Reaction: $TiO_2\text{---}O\text{---}Ti(N(CH_3)_2)_3^* + 2H_2O \rightarrow TiO_2\text{---}TiO_2\text{---}OH^* + 3(NH(CH_3)_2)$ (where "*" indicates the surface-bound species where the deposition is occurring).

In an example embodiment, a metal oxide layer of $HfO_2$ is deposited onto the surface of the substrate when the second precursor gas 218 is TDMAH (which follows the oxidation resulting from the water vapor used as the first precursor gas). The formation of the metal oxide layer of $HfO_2$ can be expressed by the following two half-reactions: $1^{st}$ Half Reaction: $Hf(N(CH_3)_2)_4 + HfO_2\text{---}OH^* + NH(CH_3)_2 + HfO_2\text{---}O\text{---}Hf(N(CH_3)_2)_3^*$; and $2^{nd}$ Half Reaction: $HfM_2\text{-}O\text{---} Hf(N(CH_3)_2)_3^* + 2H_2O + HfM_2\text{-}Hf_2\text{---}OH^* + 3(NH(CH_3)_2)$ (where "*" indicates the surface-bound species where the deposition is occurring).

In an example embodiment, a metal oxide layer of $ZrO_2$ is deposited onto the surface of the substrate when the second precursor gas 218 is TDMAZ (which follows the oxidation resulting from the water vapor used as the first precursor gas). The formation of the metal oxide layer of $ZrO_2$ can be expressed by the following two half-reactions: $1^{st}$ Half Reaction: $Zr(N(CH_3)_2)_4 + ZrO_2\text{---}OH^* \rightarrow NH(CH_3)_2 + ZrO_2\text{---}O\text{---} Zr(N(CH_3)_2)_3^*$; and $2^{nd}$ Half Reaction: $ZrO_2\text{---}O\text{---} Zr(N(CH_3)_2)_1^* + 2H_2O + ZrO_2\text{---}ZrO_2\text{---}OH^* + 3(NH(CH_3)_2)$ (where "*" indicates the surface-bound species where the deposition is occurring).

In an example embodiment, a metal oxide layer of $SnO_2$ is deposited onto the surface of the substrate when the second precursor gas 218 is TDMASn (which follows the oxidation resulting from the water vapor used as the first precursor gas). The formation of the metal oxide layer of $SnO_2$ can be expressed by the following two half-reactions: $1^{st}$ Half Reaction: $Sn(N(CH_3)_2)_4 + SnO_2\text{---}OH^*\text{---})$ $NH(CH_3)_2 + SnO_2\text{---}O\text{---} Sn(N(CH_3)_2)_3^*$; and $2^{nd}$ Half Reaction: $SnO_2\text{---}O\text{---} Sn(N(CH_3)_2)_3^* + 2H_2O \rightarrow SnO_2\text{---}SnO_2\text{---}OH^* + 3(NH(CH_3)_2)$ (where "*" indicates the surface-bound species where the deposition is occurring).

In an example embodiment, a metal oxide layer of $VO_2$ is deposited onto the surface of the substrate when the second precursor gas 218 is TDMAV (which follows the oxidation resulting from the water vapor used as the first precursor gas). The formation of the metal oxide layer of $VO_2$ can be expressed by the following two half-reactions: $1^{st}$ Half Reaction: $V(N(CH_3)_2)_4+VO_2-OH^* \rightarrow NH(CH_3)_2+VO_2-O-V(N(CH_3)_2)_3^*$; and $2^{nd}$ Half Reaction: $VO_2-O-V(N(CH_3)_2)_3^*+2H_2O \rightarrow VO_2-VO_2-OH^*+3(NH(CH_3)_2)$ (where "*" indicates the surface-bound species where the deposition is occurring).

(d) The controller 224 delays initiation of a next ALD cycle and delivery of the first precursor gas by a second preconfigured time interval (e.g., about 3.75 seconds) so that a uniform second sub-layer (e.g., one of the metal oxide layers described above) is deposited on the surface of the substrate as part of the protective layer. A non-reacting portion of the second precursor gas 218 is purged from the reaction chamber 202 via the constantly flowing carrier gas 226 (since the non-reacting portion of the second precursor gas is not being absorbed onto the surface of the substrate).

In an example embodiment, the above processing sequences (a)-(d) (associated with a single ALD cycle) may be repeated a preconfigured number of times (for a preconfigured number of a plurality of ALD cycles). The total number of ALD cycles may be configured based on a Growth-Per-Cycle (GPC) parameter for a specific thickness of the growth of the protective layer on the substrate. In some aspects, the GPC parameter is dependent on one or more of the above-listed temperature parameters for the ALD-based substrate processing system 200.

In some aspects, the plurality of ALD cycles are successive cycles (e.g., ALD cycles numbered/referenced #1-#10 are all successive cycles associated with the generation of the protective layer). In other aspects, the plurality of ALD cycles are non-successive cycles (e.g., ALD cycles numbered/referenced as #1, #3-#10 are associated with the generation of the protective layer and ALD cycle numbered/referenced #2 is not associated with the generation of the protective layer).

Figure 3:
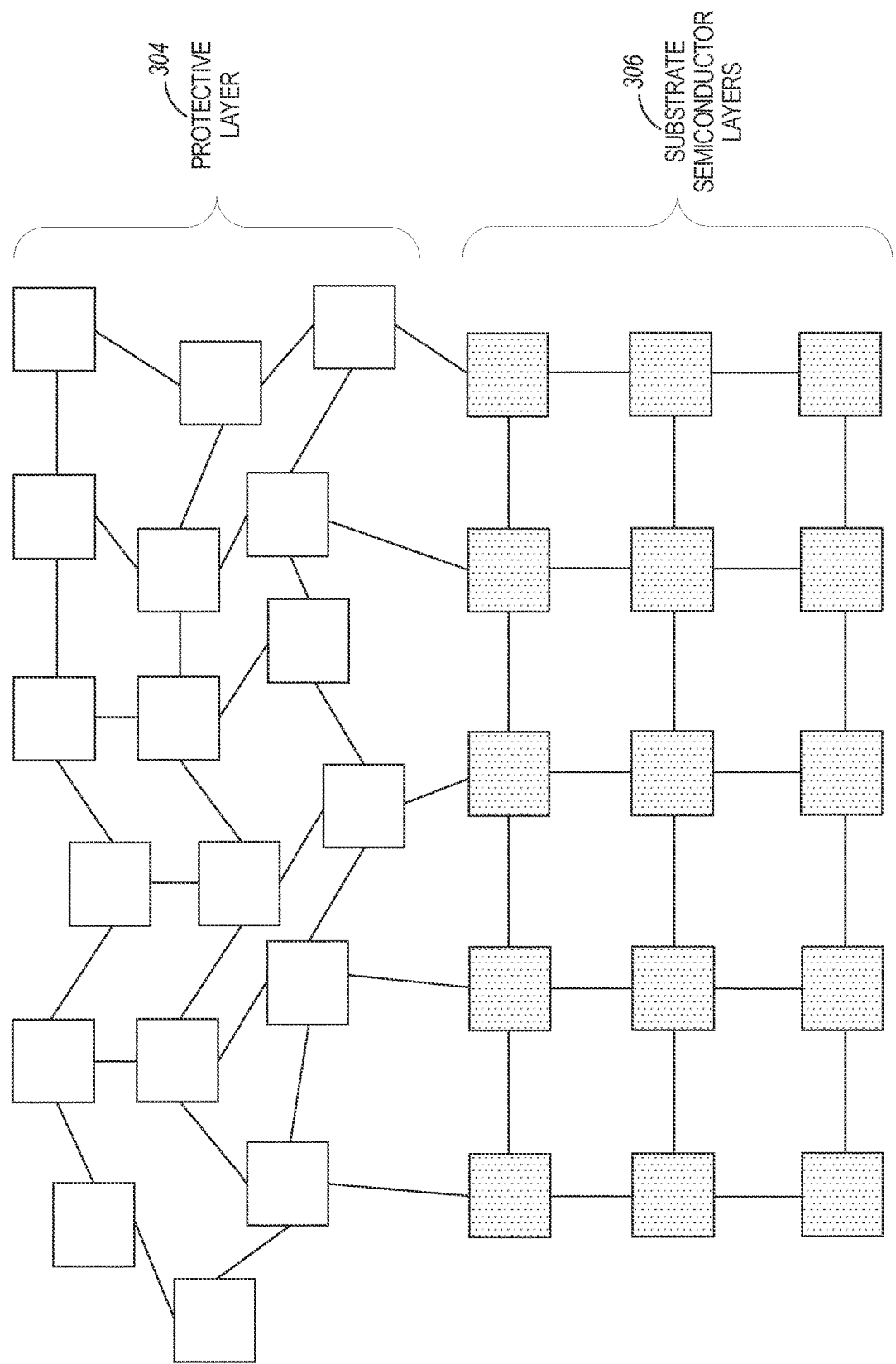
FIG. 3 is a diagram of substrate semiconductor layers and a protective layer generated using the disclosed techniques, according to some embodiments.

FIG. 3 is a diagram of substrate semiconductor layers 306 and a protective layer 304 generated using the disclosed techniques, according to some embodiments. Referring to FIG. 3, the substrate semiconductor layers 306 are formed as crystalline layers, while the protective layer 304 is formed as an amorphous protective layer based on the low-temperature generation techniques discussed herein. The anatase phase lattice mismatch associated with metal oxide compounds of the protective layer 304 exhibits negligible stress in the substrate semiconductor layers 306 below, which is beneficial for the protection of device structures within the substrate semiconductor layers 306 during metrology and analysis.

Figure 4:
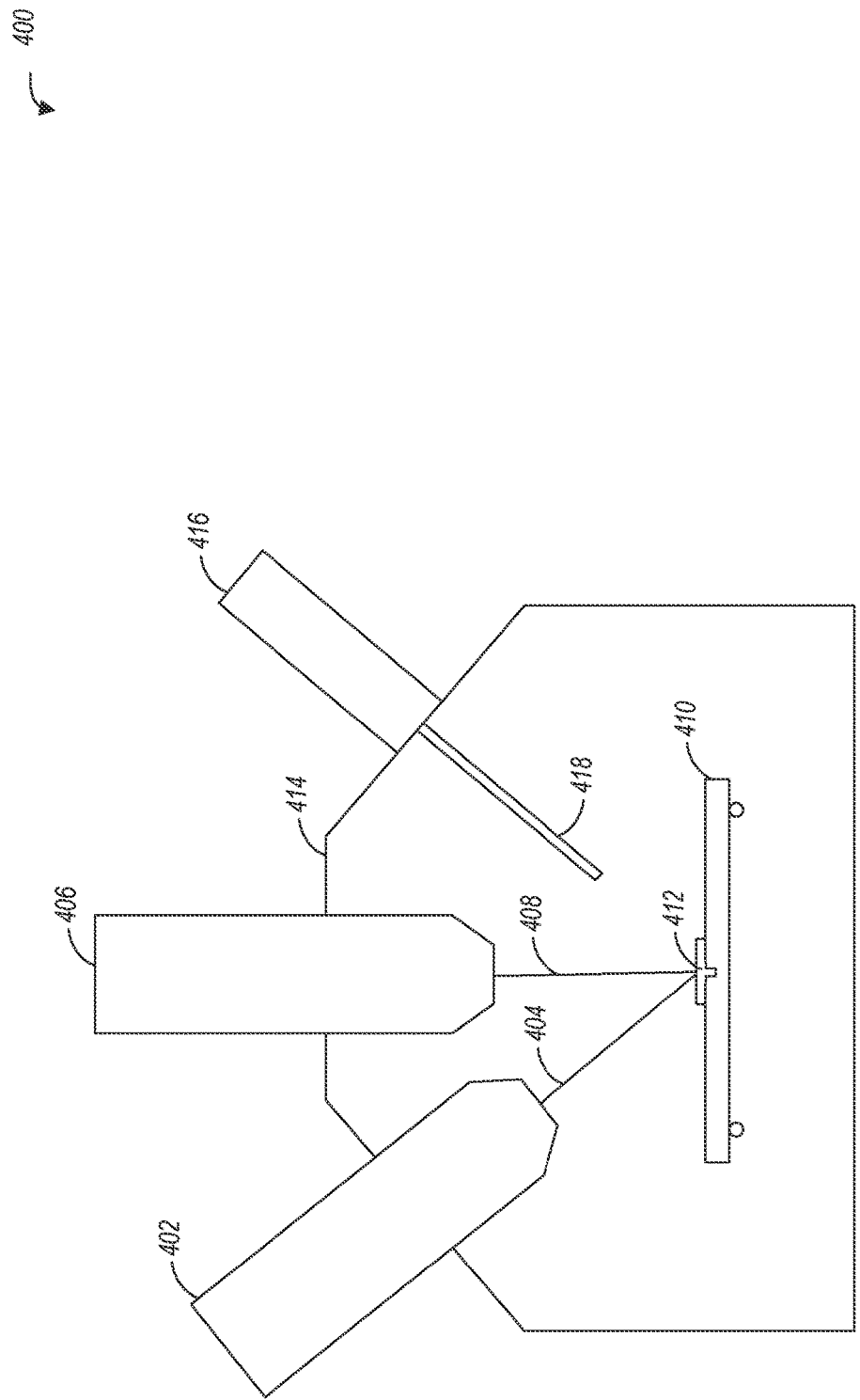
FIG. 4 is a diagram of a FIB-SEM tool using a gas injection system, according to some embodiments.

FIG. 4 is a diagram of a FIB-SEM tool 400 using a gas injection system, according to some embodiments. Referring to FIG. 4, the FEM-SIB tool 400 includes a reaction chamber 414 with an ion column 402, an electron column 406, a gas injection system (GIS) 416, a GIS needle 418, and a movable stage 410 (e.g., which can be moved in relation to multiple tilt axes while holding a substrate).

The ion column 402 may include an ion source (not illustrated) configured to generate an ion beam 404. The ion column 402 may further include optical components (not illustrated) such as electromagnetic (e.g., electrostatic) lenses, a deflector, or other optical components configured to convert the ion beam 404 into a focused ion beam (FIB). In some aspects, the FIB may be used for ion beam-induced deposition using a precursor gas introduced within the reaction chamber 414 via the GIS 416 and the GIS needle 418. In some aspects, the precursor gas may be used to enhance milling (or cutting) operation performed by the ion beam 404 on the substrate 412 supported by the movable stage 410, to produce a substrate sample (or lamella) for additional metrology and analysis (e.g., using the electron beam 408).

The electron column 406 may include an electron source (not illustrated) configured to generate an electron beam 408. The electron column 406 may further include electromagnetic lenses (not illustrated) to focus the electron beam 408 onto the substrate 412 (or the lamella produced by using the ion beam 404) for metrology and analysis (e.g., to image a surface of the lamella scanned by the electron beam 408 for critical dimension determination or other analysis). In this regard, the reaction chamber 414 may also include an electron detector and one or more electron sensors (not illustrated) to facilitate the metrology using the electron beam 408. The electron beam 408 may be used as part of a transmission electron microscope (TEM), a scanning electron microscope (SEM), a scanning transmission electron microscope (STEM), or another type of microscope using the electron beam 408 for performing metrology and analysis of the substrate 412 within the reaction chamber 414.

In an example operation, a substrate (e.g., substrate 412) that has a first protective layer already deposited using the techniques discussed in connection with FIGS. 1-3, may be inserted in the reaction chamber 414 of the FIB-SEM tool 400. An ion beam enhanced deposition (IBED) (e.g., using the ion beam 404) or an electron beam-enhanced deposition (EBED) (e.g., using the electron beam 408) is performed on the substrate 412 using one or more precursor gases introduced within the chamber 414 via the GIS needle 418 of the GIS 416 to deposit a second protective layer (e.g., on top of the first protective layer such as protective layer 304). In some aspects, the second protective layer can include one or more carbon-based and platinum-based protective layers, which can be used to enhance the substrate structure and preserve the substrate layers during milling (or slicing process) such as a process using the ion beam 404 to produce a lamella. The first layer is used for protecting substrate device structures from the electron beam 408 (or the ion beam 404) during metrology and analysis.

After deposition of the second protective layer, the ion beam 404 is used to mill (or slice) the substrate 412 to produce a substrate sample (or lamella). Metrology and other analysis may be performed on the lamella using the electron beam 408 (e.g., to determine critical dimensions of substrate device structures or other measurements).

In an example embodiment, the FIB-SEM tool 400 may use a common controller (e.g., controller 224) used for the ALD-based substrate processing system 200. In this regard, controller 224 may configure components of the FIB-SEM tool 400 as well as control various substrate processing operations within the reaction chamber 414 (including moving the substrate between the reaction chambers 202 and 414, setting rotation angles and positions of the movable stage 410, configuring and controlling the second protective layer deposition using one or more precursor gases introduced by the GIS needle 418, milling (or cutting) of the lamella using the ion beam 404, performing metrology or other analysis on the lamella using the electron beam 408, etc.). Consequently, techniques discussed herein in connection with the deposition of multiple protective layers (e.g., depositing a first protective layer as discussed in connection with FIGS. 1-3, depositing a second protective layer as discussed in connection with FIG. 4, and methods of performing deposition of both layers as discussed in connection with FIGS. 5-6) may be configured and performed by controller 224.

Figure 5:
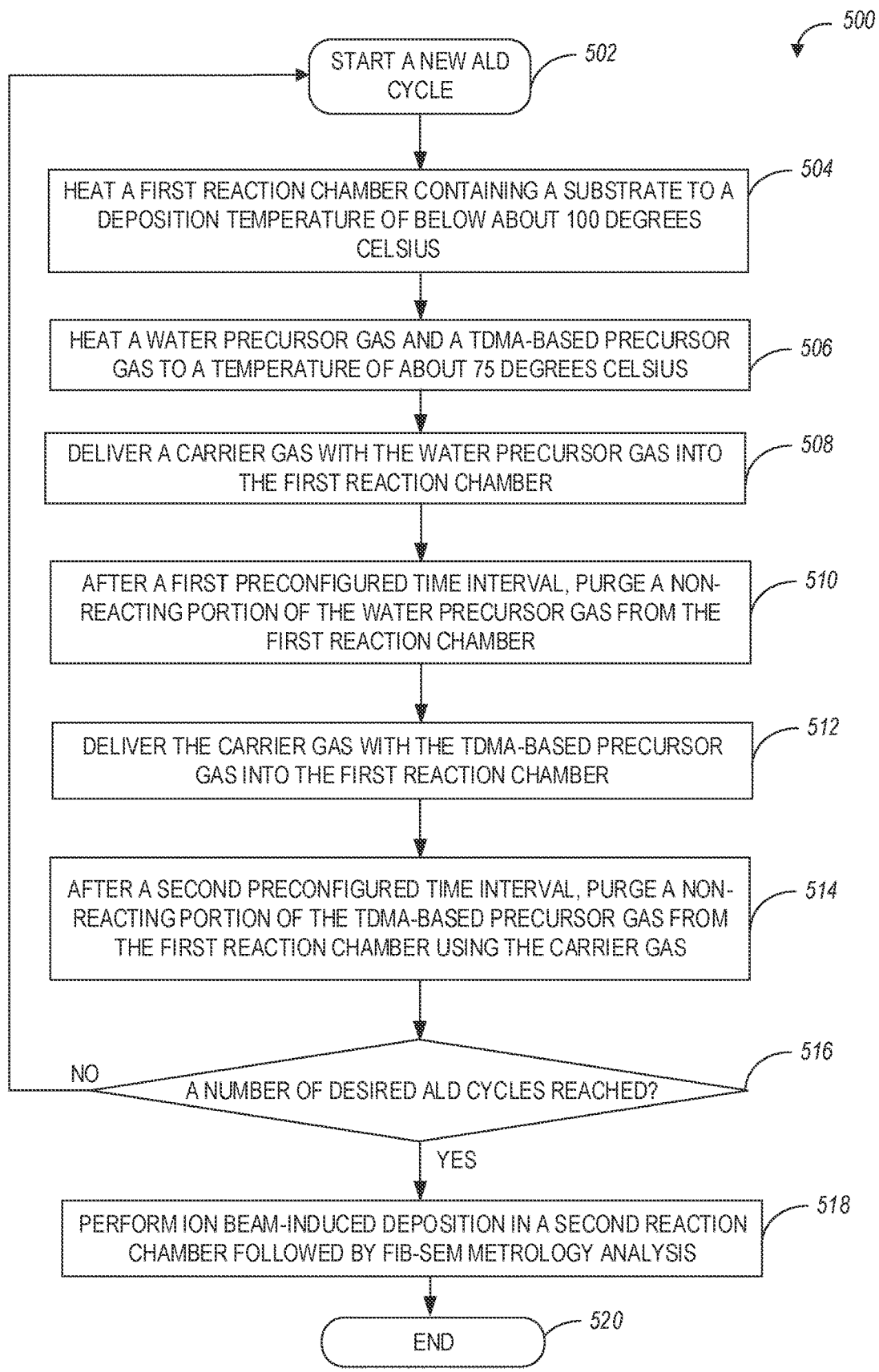
FIG. 5 is a flowchart of a method for low-temperature generation of substrate protective layers, according to some example embodiments.

FIG. 5 is a flowchart of a method 500 for the low-temperature generation of substrate protective layers, according to some example embodiments. Method 500 includes operations 502, 504, 506, 508, 510, 512, 514, 516, and 518, which may be performed by control logic (or the control logic configures or causes other modules to perform the function), such as the system controller 160 of FIG. 1 that manages the operation of the substrate processing apparatus 100 or controller 224 of FIG. 2 that manages the operation of the ALD-based substrate processing system 200 and, optionally, the operation of the FIM-SEB tool 400 of FIG. 4.

Referring to FIG. 5, at operation 502, a new ALD cycle is initiated in a first reaction chamber containing a substrate for purposes of depositing a first protective layer. At operation 504, the first reaction chamber containing the substrate is heated to a deposition temperature of below about 100° C. For example, controller 224 configures heating elements 204 to heat the reaction chamber 202 to a temperature of below about 100° C. At operation 506, a water precursor gas and a Tetrakis(dimethylamino)-(TDMA)-based precursor gas are heated to a temperature of about 75° C. For example, the controller 224 heats the water precursor gas (e.g., as a first precursor gas 216) and the TDMA-based precursor gas (e.g., a TDMA-metal precursor gas as a second precursor gas 218) to a temperature of about 75° C.

At operation 508, a carrier gas is delivered with the water precursor gas into the first reaction chamber (e.g., reaction chamber 202), a reacting portion of the water precursor being absorbed onto the surface of the substrate to form an oxide layer as part of the first protective layer. For example, controller 224 configures the carrier gas MFC 206 to initiate delivery of the carrier gas 226 (e.g., $N_2$) at a preconfigured flow rate (e.g., about 90 sccm), which delivers the first precursor gas 216 (e.g., water vapors) via the mixing manifold 230 into the reaction chamber 202. In some aspects, the controller 224 maintains a heating temperature of about 120° C. of the mixing manifold 230.

At operation 510, after a first preconfigured time interval from delivering the carrier gas with the water precursor, a non-reacting portion of the water precursor gas is purged from the first reaction chamber and, at operation 512, the carrier gas with the TDMA-based precursor gas is delivered into the reaction chamber 202. The non-reacting portion of the water precursor is a portion that is not being absorbed onto the surface of the substrate. A reacting portion of the TDMA-based precursor gas is a portion that is absorbed onto the surface of the substrate to form a metal-oxide layer (as discussed in greater detail hereinabove in connection with the listed chemical reactions for forming metal oxide layers using TDMA-metal precursors). For example, after a preconfigured time interval (or wait time) of about 3.75 seconds, controller 224 delivers the carrier gas 226 with the second precursor gas (e.g., a TDMA-metal precursor gas) into the reaction chamber 202.

At operation 514, after a second preconfigured time interval from delivering the carrier gas with the TDMA-based precursor gas, a non-reacting portion of the TDMA-based precursor gas from the first reaction chamber is purged using the carrier gas, and a determination is made (at operation 516) on whether a preconfigured number of desired ALD cycles has been completed (e.g., to achieve a desired thickness of the first protective layer). For example, controller 224 can determine the number of desired ALD cycles for generating a protective layer based on the GPC parameter associated with one or more temperature parameters for components within the ALD-based substrate processing system 200. If the number of desired ALD cycles has been reached, ALD processing and generation of the first protection layer concludes and additional substrate processing in connection with metrology continues at operation 518. If the number of desired ALD cycles has not been reached, processing resumes with a new ALD cycle at operation 402. If the number of desired ALD cycles has been reached, processing may continue at operation 518 for depositing a second protective layer and performing metrology analysis.

At operation 518, the substrate with the deposited first protective layer may be further processed in connection with a FIB-SEM metrology analysis which can be performed using a second reaction chamber (e.g., the reaction chamber 414 of the FIB-SEM tool 400 of FIG. 4). More specifically, at operation 518, the substrate with the deposited first protective layer is introduced in the second reaction chamber and an ion beam-induced deposition is conducted to deposit a second protective layer on the substrate. The second protective layer is based on a reaction between a focused ion beam (e.g., ion beam 404) and a precursor gas (e.g., a precursor gas delivered by the gas injection system 416 within the reaction chamber 414 of the FIB-SEM tool 400). In an example embodiment, the second protective layer can include one or more of a carbon-based protective layer and a platinum-based protective layer. After deposition of the second protective layer, the ion beam 404 can be used to mill (or slice) the substrate to produce a substrate sample (or lamella). FIB-SEM metrology (e.g., using the electron beam 408 generated within the reaction chamber 414 of the FIB-SEM tool 400) may be used for performing metrology (e.g., measuring critical dimensions of device structures in the lamella).

Figure 6:
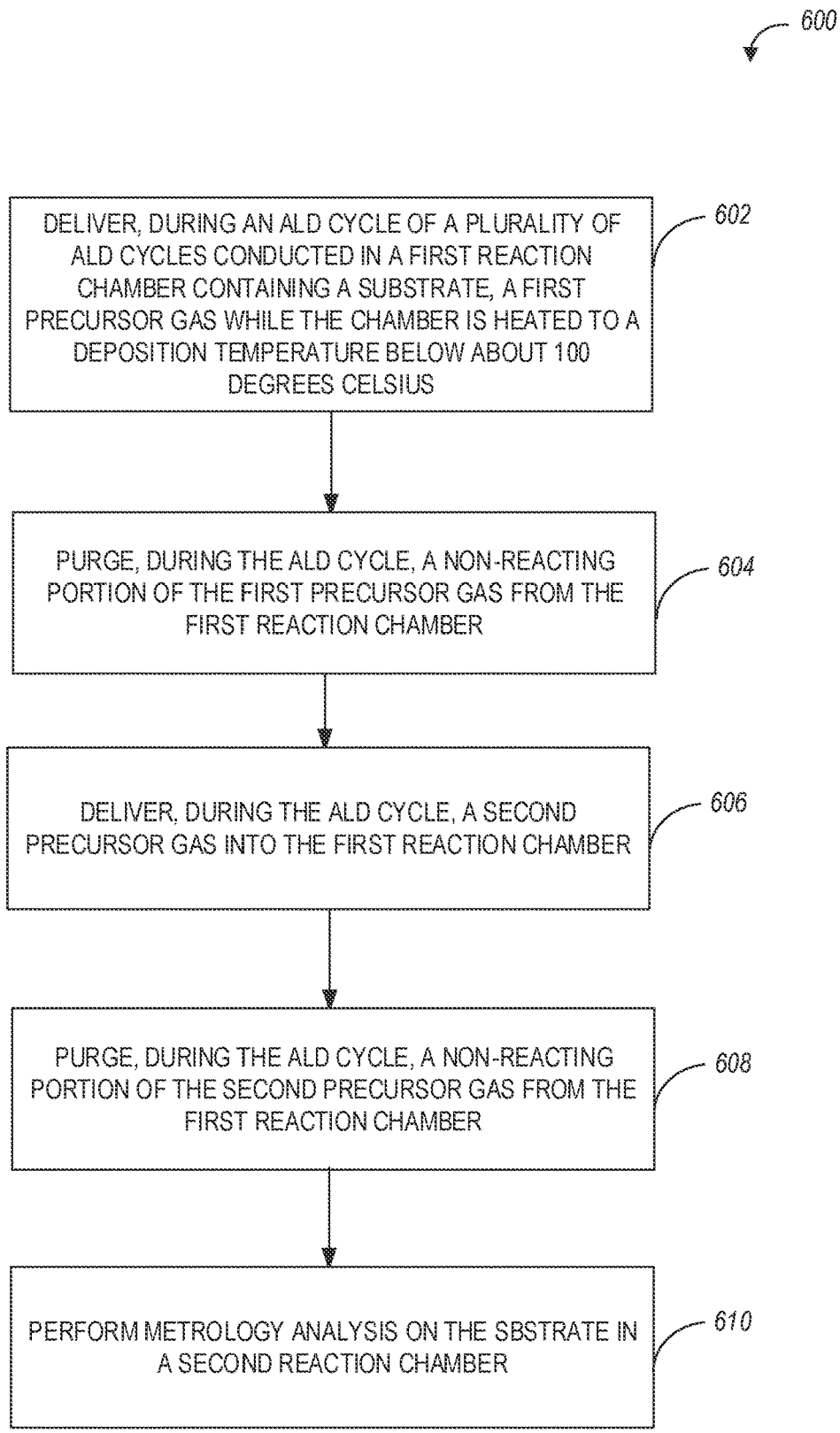
FIG. 6 is a flowchart of another method for low-temperature generation of substrate protective layers, according to some example embodiments.

FIG. 6 is a flowchart of another method 600 for the low-temperature generation of substrate protective layers, according to some example embodiments. Method 600 includes operations 602, 604, 606, 608, and 610, which may be performed by control logic (or the control logic configures or causes other modules to perform the function), such as the system controller 160 of FIG. 1 that manages the operation of the substrate processing apparatus 100 or controller 224 of FIG. 2 that manages the operation of the ALD-based substrate processing system 200 as well as the FIB-SEM tool 400 in FIG. 4.

At operation 602, during an ALD cycle of a plurality of ALD cycles conducted in a first reaction chamber to form a first protective layer on a substrate, a first precursor gas is delivered into the reaction chamber. For example, controller 224 delivers the first precursor gas 216 (e.g., water vapors) into the reaction chamber 202 using carrier gas 226. A reacting portion of the first precursor gas is absorbed onto a surface of the substrate to form a first sub-layer (e.g., an oxide layer) of a protective layer. In some aspects, the first reaction chamber is heated to a deposition temperature below about 100° C. during the plurality of ALD cycles, such as a temperature between about 40° C. and about 100° C.

At operation 604, a non-reacting portion of the first precursor gas is purged from the first reaction chamber during the ALD cycle. The non-reacting portion of the first precursor gas is not being absorbed onto the surface of the substrate and is purged with the carrier gas by pump 228.

At operation 606, a second precursor gas is delivered into the first reaction chamber containing the substrate during the ALD cycle. For example, controller 224 delivers the second precursor gas 218 (e.g., a TDMA-metal precursor gas) into the first reaction chamber 202 using carrier gas 226. A reacting portion of the second precursor gas is absorbed onto the surface of the substrate to form a second sub-layer of the first protective layer.

At operation 608, a non-reacting portion of the second precursor gas is purged from the reaction chamber during the ALD cycle. The non-reacting portion of the second precursor gas is not being absorbed onto the surface of the substrate and is purged with the carrier gas by pump 228.

In an example embodiment, the substrate with the deposited first protective layer may be further processed in connection with a FIB-SEM metrology analysis which can be performed using a second reaction chamber (e.g., the reaction chamber of the FIB-SEM tool 400 of FIG. 4). At operation 610, metrology analysis is performed on the substrate in the second reaction chamber. For example, the substrate with the deposited first protective layer is introduced in the second reaction chamber and an ion beam-induced deposition is conducted to deposit a second protective layer on the substrate. The second protective layer is based on a reaction between a focused ion beam (e.g., ion beam 404) and a precursor gas (e.g., a precursor gas delivered by the gas injection system 416 within the reaction chamber 414 of the FIB-SEM tool 400). In an example embodiment, the second protective layer can include one or more of a carbon-based protective layer and a platinum-based protective layer. After deposition of the second protective layer, the ion beam 404 can be used to mill (or slice) the substrate to produce a substrate sample (or lamella). Metrology analysis can be performed on the lamella (e.g., to measure critical dimensions and other measurements associated with device structures in the lamella) using an electron beam (e.g., the electron beam 408) introduced in the second reaction chamber 414 via the electron column 406 for electron beam generation. In some aspects, the second protective layer can aid in the protection of substrate device structures during the milling (or slicing) of the lamella, while the first protective layer protects the substrate device structures during the metrology analysis using the electron beam 408.

Figure 7:
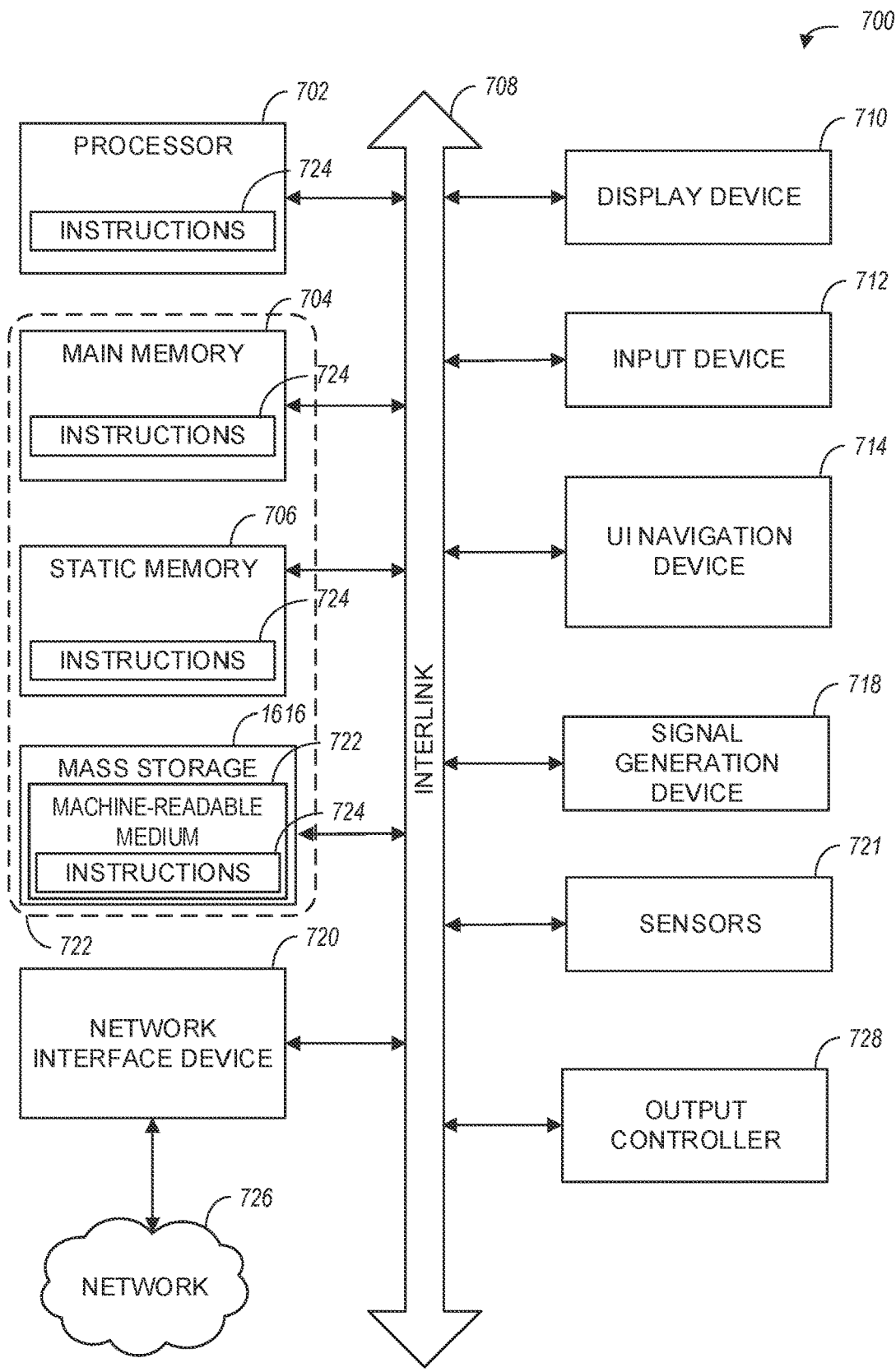
FIG. 7 is a block diagram illustrating an example of a machine upon which one or more example method embodiments may be implemented, or by which one or more example embodiments may be controlled.

FIG. 7 is a block diagram illustrating an example of a machine 700 upon which one or more example method embodiments may be implemented, or by which one or more example embodiments may be controlled. In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in a peer-to-peer (P2P) (or other distributed) network environment. Further, while only a single machine 700 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, several components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when operating. In an example, the hardware of the circuitry may be immutably designed to carry out a specific operation (e.g., hardwired). In an example, the hardware of the circuitry may include variably connected physical components (e.g., execution units, transistors, simple circuits) including a computer-readable medium physically modified (e.g., magnetically, electrically, by the moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In some aspects, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 700 may include a hardware processor 702 (e.g., a central processing unit (CPU), a hardware processor core, a graphics processing unit (GPU), or any combination thereof), a main memory 704, and a static memory 706, some or all of which may communicate with each other via an interlink (e.g., bus) 708. The machine 700 may further include a display device 710, an alphanumeric input device 712 (e.g., a keyboard), and a user interface (UI) navigation device 714 (e.g., a mouse). In an example, the display device 710, alphanumeric input device 712, and UI navigation device 714 may be a touch screen display. The machine 700 may additionally include a mass storage device (e.g., drive unit) 716, a signal generation device 718 (e.g., a speaker), a network interface device 720, and one or more sensors 721, such as a Global Positioning System (GPS) sensor, compass, accelerometer, or another sensor. The machine 700 may include an output controller 728, such as a serial (e.g., universal serial bus (USB)), parallel, or other wired or wireless (e.g., infrared (IR), near field communication (NFC)) connection to communicate with or control one or more peripheral devices (e.g., a printer, card reader).

In an example embodiment, the hardware processor 702 may perform the functionalities of the system controller 160, controller 224, or any control logic discussed hereinabove to configure and control functionalities described herein (e.g., as discussed in connection with at least FIG. 1-FIG. 6).

The mass storage device 716 may include a machine-readable medium 722 on which is stored one or more sets of data structures or instructions 724 (e.g., software) embodying or utilized by any one or more of the techniques or functions described herein. The instructions 724 may also reside, completely or at least partially, within the main memory 704, within the static memory 706, or within the hardware processor 702 during execution thereof by the machine 700. In an example, one or any combination of the hardware processor 702, the main memory 704, the static memory 706, or the mass storage device 716 may constitute machine-readable media.

While the machine-readable medium 722 is illustrated as a single medium, the term "machine-readable medium" may include a single medium or multiple media, (e.g., a centralized or distributed database, and/or associated caches and servers) configured to store the one or more instructions 724.

The term "machine-readable medium" may include any medium that is capable of storing, encoding, or carrying instructions 724 for execution by the machine 700 and that cause the machine 700 to perform any one or more of the techniques of the present disclosure, or that is capable of storing, encoding, or carrying data structures used by or associated with such instructions 724. Non-limiting machine-readable medium examples may include solid-state memories and optical and magnetic media. In an example, a massed machine-readable medium comprises a machine-readable medium 722 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 724 may further be transmitted or received over a communications network 726 using a transmission medium via the network interface device 720.

Implementation of the preceding techniques may be accomplished through any number of specifications, configurations, or example deployments of hardware and software. It should be understood that the functional units or capabilities described in this specification may have been referred to or labeled as components or modules, to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field-programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules and may be embodied in any suitable form and organized within any suitable type of data structure. The operational data may be collected as a single data set or may be distributed over different locations including over different storage devices, and may exist, at least partially, merely as electronic signals on a system or network. The components or modules may be passive or active, including agents operable to perform desired functions.

ADDITIONAL NOTES & EXAMPLES

Example 1 is a method for depositing protective layers on a surface of a substrate, the method comprising: conducting a plurality of Atomic Layer Deposition (ALD) cycles in a first reaction chamber to deposit a first protective layer on the substrate, each ALD cycle of the plurality of ALD cycles conducted at a deposition temperature below about 100 degrees Celsius and comprising: delivering a first precursor gas into the first reaction chamber containing the substrate, a reacting portion of the first precursor gas being absorbed onto a surface of the substrate to form a first sub-layer of the protective layer; purging a non-reacting portion of the first precursor gas from the first reaction chamber, the non-reacting portion of the first precursor gas not being absorbed onto the surface of the substrate; delivering a second precursor gas into the first reaction chamber containing the substrate, a reacting portion of the second precursor gas being absorbed onto the surface of the substrate to form a second sub-layer of the protective layer; and purging a non-reacting portion of the second precursor gas from the first reaction chamber, the non-reacting portion of the second precursor gas not being absorbed onto the surface of the substrate: and performing metrology analysis on the substrate within a second reaction chamber.

In some aspects, the plurality of ALD cycles are successive cycles (e.g., ALD cycles numbered/referenced #1-#10 are all successive cycles associated with the generation of the protective layer). In other aspects, the plurality of ALD cycles are non-successive cycles (e.g., ALD cycles numbered/referenced as #1, #3-#10 are associated with the generation of the protective layer and ALD cycle numbered/referenced #2 is not associated with the generation of the protective layer).

In Example 2, the subject matter of Example 1 includes, wherein the first precursor gas is water vapor and the first sub-layer is an oxide layer on the surface of the substrate.

In Example 3, the subject matter of Example 2 includes, wherein the second precursor gas is a Tetrakis(dimethylamino)-(TDMA)-based precursor gas, and the second sub-layer is a metal-oxide layer on the surface of the substrate.

In Example 4, the subject matter of Example 3 includes, wherein the Tetrakis(dimethylamino)-(TDMA)-based precursor gas is one of the following: Tetrakis(dimethylamino) hafnium(IV); Tetrakis(dimethylamino)titanium(IV); Tetrakis(dimethylamino)zirconium(IV); Tetrakis(dimethylamino) tin(W); and Tetrakis(dimethylamino)vanadium(IV).

In Example 5, the subject matter of Examples 1-4 includes, heating the first reaction chamber to a temperature from about 40 degrees Celsius to about 100 degrees Celsius to reach the deposition temperature.

In Example 6, the subject matter of Example 5 includes, maintaining the deposition temperature for a duration of the plurality of ALD cycles.

In Example 7, the subject matter of Examples 1-6 includes, heating the first precursor gas and the second precursor gas to a temperature of about 75 degrees Celsius.

In Example 8, the subject matter of Example 7 includes, delivering the first precursor gas and the second precursor gas into the first reaction chamber using a carrier gas, the carrier gas passing through a precursor manifold in fluid communication with the first reaction chamber, and wherein delivery of the second precursor gas is separated from delivery of the first precursor gas by a preconfigured time interval.

In Example 9, the subject matter of Example 8 includes) and the method further comprises: heating the precursor manifold to a temperature of about 120 degrees Celsius for a duration of the plurality of ALD cycles.

In Example 10, the subject matter of Examples 1-9 includes, conducting an ion beam-induced deposition in the second reaction chamber to deposit a second protective layer on the substrate, the second protective layer based on a reaction between the ion beam and a precursor gas within the second reaction chamber.

In Example 11, the subject matter of Example 10 includes, wherein the second protective layer is at least one of a carbon-based protective layer and a platinum-based protective layer, and the method further comprises: performing the metrology analysis within the second reaction chamber using an electron beam emitted towards the second protective layer of the substrate.

Example 12 is an apparatus for processing a substrate, the apparatus comprising: a reaction chamber containing the substrate; a chemical delivery module in fluid communication with the reaction chamber, the chemical delivery module including or connected to a plurality of precursor gas sources; a controller coupled to the reaction chamber and the chemical delivery module, the controller configured to perform Atomic Layer Deposition (ALD) operations comprising: delivering a first precursor gas from the chemical delivery module into the reaction chamber, a reacting portion of the first precursor gas being absorbed onto a surface of the substrate to form a first sub-layer of a protective layer; delivering a second precursor gas from the chemical delivery module into the reaction chamber, a reacting portion of the second precursor gas being absorbed onto the surface of the substrate to form a second sub-layer of the protective layer, and maintaining a deposition temperature within the reaction chamber from about 40 degrees Celsius to about 100 degrees Celsius during forming the first and second sub-layers of the protective layer; and a pump coupled to the reaction chamber, the pump configured to purge non-reacting portions of the first precursor gas and the second precursor gas from the reaction chamber.

In Example 13, the subject matter of Example 12 includes, the apparatus comprising a carrier gas source configured to supply a carrier gas into a precursor manifold in fluid communication with the reaction chamber, and wherein the controller is configured to deliver the first precursor gas and the second precursor gas into the reaction chamber using the carrier gas, wherein delivery of the second precursor gas is separated from delivery of the first precursor gas by a preconfigured time interval.

In Example 14, the subject matter of Example 13 includes, wherein the controller is further configured to heat the first precursor gas and the second precursor gas to a temperature of about 75 degrees Celsius; and heat the precursor manifold to a temperature of about 120 degrees Celsius during the ALD operation.

In Example 15, the subject matter of Examples 12-14 includes, wherein the controller is further configured to: heat the first precursor gas and the second precursor gas to a temperature of about 75 degrees Celsius.

In Example 16, the subject matter of Examples 12-15 includes, wherein the first precursor gas is water vapor and the first sub-layer is an oxide layer on the surface of the substrate.

In Example 17, the subject matter of Examples 12-16 includes, wherein the second sub-layer is a metal-oxide layer on the surface of the substrate, and the second precursor gas is one of the following: Tetrakis(dimethylamino)hafnium (IV): Tetrakis(dimethylamino)titanium(IV); Tetrakis(dimethylamino)zirconium(IV); Tetrakis(dimethylamino)tin (IV); and Tetrakis(dimethylamino)vanadium(IV).

Example 18 is a method for depositing protective layers on a surface of a substrate, comprising: conducting a plurality of Atomic Layer Deposition (ALD) cycles in a first reaction chamber to deposit a first protective layer on the substrate, an ALD cycle of the plurality of ALD cycles comprising: heating the first reaction chamber containing the substrate to a deposition temperature of below about 100 degrees Celsius: delivering a carrier gas with a water precursor gas into the first reaction chamber, a reacting portion of the water precursor being absorbed onto the surface of the substrate to form an oxide layer; delivering the carrier gas with a Tetrakis(dimethylamino)-(TDMA)-based precursor gas into the first reaction chamber, a reacting portion of the TDMA-based precursor gas being absorbed onto the surface of the substrate to form a metal-oxide layer; and purging a non-reacting portion of the TDMA-based precursor gas from the first reaction chamber using the carrier gas, the non-reacting portion of the TDMA-based precursor gas not being absorbed onto the surface of the substrate; and perform metrology analysis on the substrate within a second reaction chamber.

In Example 19, the subject matter of Example 18 includes, purging a non-reacting portion of the water precursor gas from the first reaction chamber, the non-reacting portion of the water precursor not being absorbed onto the surface of the substrate, wherein the non-reacting portion of the water precursor gas is purged after a first preconfigured time interval from delivering the carrier gas with the water precursor, and wherein the non-reacting portion of the TDMA-based precursor gas is purged after a second preconfigured time interval from delivering the carrier gas with the TDMA-based precursor gas.

In Example 20, the subject matter of Examples 18-19 includes, heating the water precursor gas and the TDMA-based precursor gas to a temperature of about 75 degrees Celsius.

In Example 21, the subject matter of Examples 18-20 includes, delivering the carrier gas during the ALD cycle through a precursor manifold in fluid communication with the first reaction chamber; and heating the precursor manifold to a temperature of about 120 degrees Celsius for a duration of the plurality of ALD cycles.

In Example 22, the subject matter of Examples 18-21 includes, conducting an ion beam-induced deposition in the second reaction chamber to deposit a second protective layer on the substrate, the second protective layer based on a reaction between the ion beam and a precursor gas within the second reaction chamber.

In Example 23, the subject matter of Example 22 includes, milling the substrate with the second protective layer deposited within the second reaction chamber using the ion beam to obtain a lamella: and perform the metrology analysis on the lamella using an electron beam generated by an electron beam column within the second reaction chamber.

Example 24 is at least one machine-readable medium including instructions that, when executed by processing circuitry, cause the processing circuitry to perform operations to implement any of Examples 1-23.

Example 25 is an apparatus comprising means to implement any of Examples 1-23.

Example 26 is a system to implement any of Examples 1-23.

Example 27 is a method to implement any of Examples 1-23.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components for example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

The claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within the scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A method for depositing protective layers on a surface of a substrate, the method comprising:
    conducting a plurality of Atomic Layer Deposition (ALD) cycles in a first reaction chamber to deposit a first protective layer on the substrate, each ALD cycle of the plurality of ALD cycles conducted at a deposition temperature of above 40 degrees Celsius and below 100 degrees Celsius, and comprising:
        delivering a first precursor gas into the first reaction chamber containing the substrate, a reacting portion of the first precursor gas being absorbed onto a surface of the substrate to form a first sub-layer of the first protective layer;
        purging a non-reacting portion of the first precursor gas from the first reaction chamber, the non-reacting portion of the first precursor gas not being absorbed onto the surface of the substrate;
        delivering a second precursor gas into the first reaction chamber containing the substrate, a reacting portion of the second precursor gas being absorbed onto the surface of the substrate to form a second sub-layer of the first protective layer; and
        purging a non-reacting portion of the second precursor gas from the first reaction chamber, the non-reacting portion of the second precursor gas not being absorbed onto the surface of the substrate;
        dynamically modulating flow of the first precursor gas and the second precursor gas based on uniformity of the first and second sub-layers; and
    performing metrology analysis on the substrate within a second reaction chamber.

2. The method of claim 1, wherein the first precursor gas is water vapor and the first sub-layer is an oxide layer on the surface of the substrate.

3. The method of claim 2, wherein the second precursor gas is a Tetrakis(dimethylamino)-(TDMA)-based precursor gas, and the second sub-layer is a metal-oxide layer on the surface of the substrate.

4. The method of claim 3, wherein the TDMA-based precursor gas is one of the following:
    Tetrakis(dimethylamino)hafnium(IV);
    Tetrakis(dimethylamino)titanium(IV);
    Tetrakis(dimethylamino)zirconium(IV);
    Tetrakis(dimethylamino)tin(IV); and
    Tetrakis(dimethylamino)vanadium(IV).

5. The method of claim 1, further comprising:
    heating the first reaction chamber to a temperature above 40 degrees Celsius and below 100 degrees Celsius to reach the deposition temperature.

6. The method of claim 5, further comprising:
    maintaining the deposition temperature for a duration of the plurality of ALD cycles.

7. The method of claim 1, further comprising:
    heating the first precursor gas and the second precursor gas to a temperature of about 75 degrees Celsius.

8. The method of claim 7, wherein the delivering of the first precursor gas and the delivering of the second precursor gas into the first reaction chamber uses a carrier gas, the carrier gas passing through a precursor manifold in fluid communication with the first reaction chamber, and
    wherein the delivering of the second precursor gas is separated from the delivering of the first precursor gas by a preconfigured time interval.

9. The method of claim 8, wherein the carrier gas is nitrogen ($N_2$) and the method further comprises:
    heating the precursor manifold to a temperature of about 120 degrees Celsius for a duration of the plurality of ALD cycles.

10. The method of claim 1, further comprising:
    conducting an ion beam-induced deposition in the second reaction chamber to deposit a second protective layer on the substrate, the second protective layer based on a reaction between the ion beam and a precursor gas within the second reaction chamber.

11. The method of claim 10, wherein the second protective layer is at least one of a carbon-based protective layer and a platinum-based protective layer, and the method further comprises:
performing the metrology analysis within the second reaction chamber using an electron beam emitted towards the second protective layer of the substrate.

12. An apparatus for processing a substrate, the apparatus comprising:
a reaction chamber containing the substrate;
a chemical delivery module in fluid communication with the reaction chamber, the chemical delivery module including or connected to a plurality of precursor gas sources;
a controller coupled to the reaction chamber and the chemical delivery module, the controller configured to perform Atomic Layer Deposition (ALD) operations comprising:
delivering a first precursor gas from the chemical delivery module into the reaction chamber, a reacting portion of the first precursor gas being absorbed onto a surface of the substrate to form a first sub-layer of a protective layer;
delivering a second precursor gas from the chemical delivery module into the reaction chamber, a reacting portion of the second precursor gas being absorbed onto the surface of the substrate to form a second sub-layer of the protective layer;
dynamically modulating flow of the first precursor gas and the second precursor gas based on uniformity of the first and second sub-layers; and
maintaining a deposition temperature within the reaction chamber from about 40 degrees Celsius to about 100 degrees Celsius during forming the first and second sub-layers of the protective layer; and
a pump coupled to the reaction chamber, the pump configured to purge non-reacting portions of the first precursor gas and the second precursor gas from the reaction chamber.

13. The apparatus of claim 12, the apparatus comprising a carrier gas source configured to supply a carrier gas into a precursor manifold in fluid communication with the reaction chamber, and wherein the controller is configured to:
deliver the first precursor gas and the second precursor gas into the reaction chamber using the carrier gas, wherein delivery of the second precursor gas is separated from delivery of the first precursor gas by a preconfigured time interval.

14. The apparatus of claim 13, wherein the controller is further configured to:
heat the first precursor gas and the second precursor gas to a temperature of about 75 degrees Celsius; and
heat the precursor manifold to a temperature of about 120 degrees Celsius during the ALD operation.

15. The apparatus of claim 12, wherein the controller is further configured to:
heat the first precursor gas and the second precursor gas to a temperature of about 75 degrees Celsius.

16. The apparatus of claim 12, wherein the first precursor gas is water vapor and the first sub-layer is an oxide layer on the surface of the substrate.

17. The apparatus of claim 12, wherein the second sub-layer is a metal-oxide layer on the surface of the substrate, and the second precursor gas is one of the following:
Tetrakis(dimethylamino)hafnium(IV);
Tetrakis(dimethylamino)titanium(IV);
Tetrakis(dimethylamino)zirconium(IV);
Tetrakis(dimethylamino)tin(IV); and
Tetrakis(dimethylamino)vanadium(IV).

18. A method for depositing protective layers on a surface of a substrate, comprising:
conducting a plurality of Atomic Layer Deposition (ALD) cycles in a first reaction chamber to deposit a first protective layer on the substrate, an ALD cycle of the plurality of ALD cycles comprising:
heating the first reaction chamber containing the substrate to a deposition temperature of below about 100 degrees Celsius;
delivering a carrier gas with a water precursor gas into the first reaction chamber, a reacting portion of the water precursor being absorbed onto the surface of the substrate to form an oxide layer;
delivering the carrier gas with a Tetrakis(dimethylamino)-(TDMA)-based precursor gas into the first reaction chamber, a reacting portion of the TDMA-based precursor gas being absorbed onto the surface of the substrate to form a metal-oxide layer; and
purging a non-reacting portion of the TDMA-based precursor gas from the first reaction chamber using the carrier gas, the non-reacting portion of the TDMA-based precursor gas not being absorbed onto the surface of the substrate; and
dynamically modulating flow of the water precursor gas and the TDMA-based precursor gas based on uniformity of the oxide layer and the metal-oxide layer; and
perform metrology analysis on the substrate within a second reaction chamber.

19. The method of claim 18, further comprising:
purging a non-reacting portion of the water precursor gas from the first reaction chamber, the non-reacting portion of the water precursor not being absorbed onto the surface of the substrate,
wherein the non-reacting portion of the water precursor gas is purged after a first preconfigured time interval from delivering the carrier gas with the water precursor, and
wherein the non-reacting portion of the TDMA-based precursor gas is purged after a second preconfigured time interval from delivering the carrier gas with the TDMA-based precursor gas.

20. The method of claim 18, further comprising:
heating the water precursor gas and the TDMA-based precursor gas to a temperature of about 75 degrees Celsius.

21. The method of claim 18, further comprising:
delivering the carrier gas during the ALD cycle through a precursor manifold in fluid communication with the first reaction chamber; and
heating the precursor manifold to a temperature of about 120 degrees Celsius for a duration of the plurality of ALD cycles.

22. The method of claim 18, further comprising:
conducting an ion beam-induced deposition in the second reaction chamber to deposit a second protective layer on the substrate, the second protective layer based on a reaction between the ion beam and a precursor gas within the second reaction chamber.

23. The method of claim 22, further comprising:
milling the substrate with the second protective layer deposited within the second reaction chamber using the ion beam to obtain a lamella; and perform the metrology analysis on the lamella using an electron beam generated by an electron beam column within the second reaction chamber.

* * * * *